United States Patent
Padalia et al.

(10) Patent No.: US 7,441,208 B1
(45) Date of Patent: Oct. 21, 2008

(54) METHODS FOR DESIGNING INTEGRATED CIRCUITS

(75) Inventors: Ketan Padalia, Thornhill (CA); Vaughn Betz, Toronto (CA); Vadim Gouterman, Toronto (CA)

(73) Assignee: Altera Corporation, San Jose, CA (US)

( * ) Notice: Subject to any disclaimer, the term of this patent is extended or adjusted under 35 U.S.C. 154(b) by 375 days.

(21) Appl. No.: 11/225,919

(22) Filed: Sep. 13, 2005

(51) Int. Cl.
*G06F 17/50* (2006.01)

(52) U.S. Cl. .................................. 716/1; 716/8; 716/18
(58) Field of Classification Search .................. 716/18, 716/1, 8
See application file for complete search history.

(56) References Cited

U.S. PATENT DOCUMENTS

| | | | |
|---|---|---|---|
| 5,854,924 A * | 12/1998 | Rickel et al. | 717/132 |
| 5,867,399 A * | 2/1999 | Rostoker et al. | 716/18 |
| 6,470,482 B1 * | 10/2002 | Rostoker et al. | 716/6 |
| 6,775,808 B1 * | 8/2004 | Raje et al. | 716/4 |
| 7,006,962 B1 * | 2/2006 | Goyal et al. | 703/18 |
| 7,269,815 B2 * | 9/2007 | Wein et al. | 716/18 |
| 7,275,232 B2 * | 9/2007 | Schleicher et al. | 716/16 |
| 2004/0006584 A1 * | 1/2004 | Vandeweerd | 709/107 |
| 2004/0181717 A1 * | 9/2004 | Madge et al. | 714/724 |
| 2005/0156612 A1 * | 7/2005 | Pochmuller | 324/754 |
| 2005/0229141 A1 * | 10/2005 | Kawa et al. | 716/17 |
| 2005/0268258 A1 * | 12/2005 | Decker | 716/4 |
| 2005/0268267 A1 * | 12/2005 | Shang | 716/9 |
| 2005/0268269 A1 * | 12/2005 | Coiley | 716/11 |
| 2006/0225008 A1 * | 10/2006 | Schleicher et al. | 716/3 |
| 2007/0033557 A1 * | 2/2007 | Byrn et al. | 716/5 |
| 2007/0294659 A1 * | 12/2007 | Schleicher et al. | 716/18 |

* cited by examiner

*Primary Examiner*—Jack Chiang
*Assistant Examiner*—Suchin Parihar
(74) *Attorney, Agent, or Firm*—Ropes & Gray LLP; Robert R. Jackson

(57) ABSTRACT

The process of designing an integrated circuit ("IC") to implement a generalized circuit design includes a signoff between a front-end part of the process and a back-end part of the process. This signoff preferably takes place after at least some global routing has been done for the IC implementation, but before all final detailed routing is done for that implementation.

18 Claims, 5 Drawing Sheets

METHODS FOR DESIGNING INTEGRATED CIRCUITS

BACKGROUND OF THE INVENTION

This invention relates to methods for designing integrated circuits.

Integrated circuit design is a complex task involving many steps. The process typically begins with a circuit design that is specified in terms having little or nothing to do with how it can be implemented in an integrated circuit. This relatively abstract, starting circuit design passes through a succession of steps that gradually move it more and more toward a design specification for building an actual integrated circuit. As this process proceeds, it is very common for responsibility for it to pass from the people who have done the initial circuit design to different people who do the work that is closer to production of the integrated circuit. These may be two different groups of people in one company or organization, or they may be people in two different companies or organizations.

Various points in the above-described process have been used as the "signoff" point between the circuit design group and the integrated circuit ("IC") design group. If the signoff point is relatively early in the process, the circuit design group's task is relatively easy, but it may be difficult or impossible for the IC design group to produce an IC design (and therefore an IC) that meets all the expectations and specifications of the circuit design group. For example, timing constraints supplied by the circuit design group may not be achievable by the IC design group, which may force the IC design group to return the project to the first group for a redesign. This is generally very undesirable for reasons such as cost, delay, and the like. On the other hand, the later in the process the signoff point is, the more difficult and time-consuming the circuit designers' part of the task is for them. Making the signoff point very late in the process takes the circuit designers into parts of the process that they may be less familiar with and/or less skilled at. It does, however, tend to increase the probability that what they hand off to the IC design group will be implementable without any circuit redesign and will have timing performance close to what is expected and desired.

SUMMARY OF THE INVENTION

In accordance with this invention, a method of designing an integrated circuit to implement a user's circuit design has a signoff point after global routing has been done for an IC implementation of the circuit design, but before final detailed routing is done for that IC implementation. The signoff point of this invention may be either before or after a buffer insertion step. The signoff point of this invention may also be before or after a partial track assignment step. The signoff point of this invention may also be before or after a partial detailed router step.

Further features of the invention, its nature and various advantages, will be more apparent from the accompanying drawings and the following detailed description.

DETAILED DESCRIPTION

Figure 1:
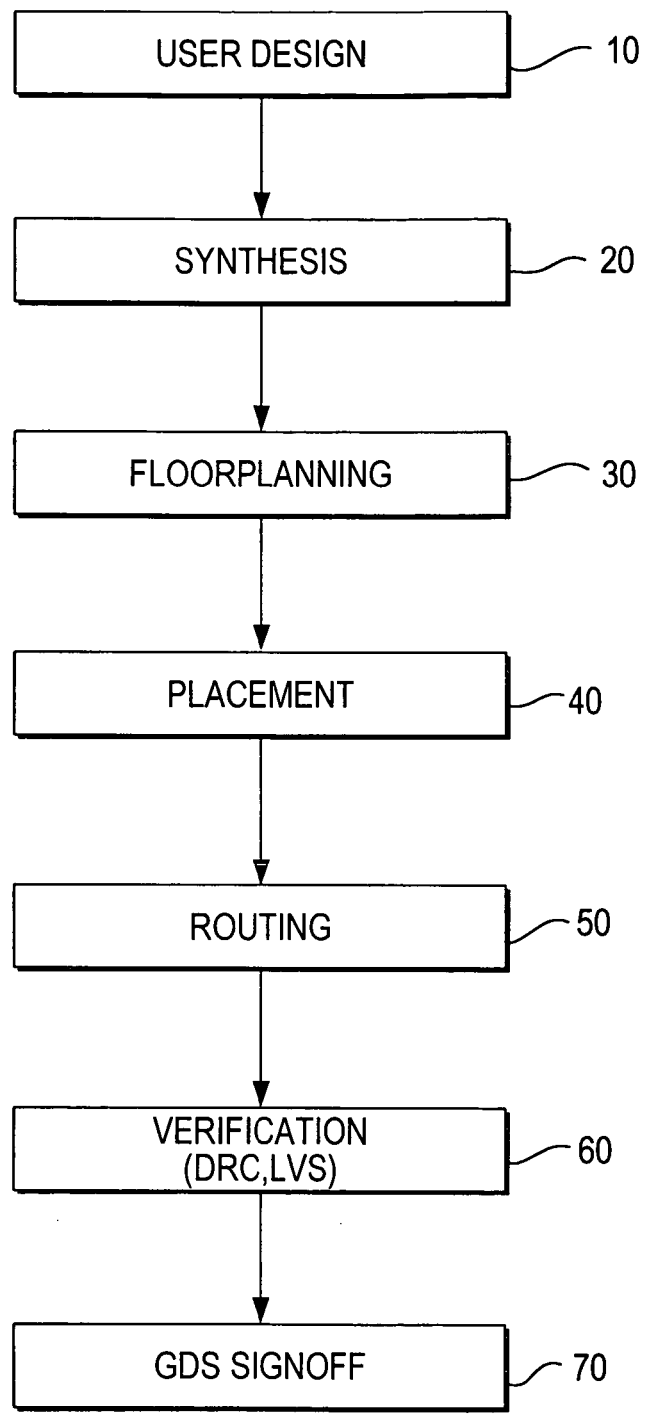
FIG. 1 is a simplified flow diagram of an illustrative process for designing an integrated circuit to implement a circuit design.

A typical process for designing an integrated circuit to implement a circuit design is shown in FIG. 1. The process begins with a specification 10 for the circuit that it is desired to have implemented in an IC. Circuit design 10 may be expressed in a high-level design language such as Verilog. It is typically wholly or at least partly abstract in relation to how the circuit can and/or should be implemented in an IC. In other words, it typically specifies none or at most relatively few of the details of any actual IC implementation.

In step 20 the user's circuit design (from step 10) is synthesized for the particular IC technology that it is desired to use for the IC implementation. For example, it may be desired to implement the circuit on a structured application-specific integrated circuit (a "structured ASIC"). Synthesis step 20 will then map user design 10 to a version of that design that is suitable for implementation in this type of technology. (Examples of structured ASIC technology are shown in such references as Chua et al. U.S. patent application Ser. No. 10/884,460, filed Jul. 2, 2004, Yuan et al. U.S. patent application Ser. No. 10/916,305, filed Aug. 11, 2004, Schleicher et al. U.S. patent application Ser. No. 11/050,607, filed Feb. 3, 2005, Yuan et al. U.S. patent application Ser. No. 11/101,949, filed Apr. 8, 2005, Pedersen et al. U.S. patent application Ser. No. 11/072,560, filed Mar. 3, 2005, Lim et al. U.S. patent application Ser. No. 11/141,867, filed May 31, 2005, Schleicher et al. U.S. patent application Ser. No. 11/097,633, filed Apr. 1, 2005, and Tan et al. U.S. patent application Ser. No. 11/141,941, filed May 31, 2005. It will be understood, however, that structured ASICs are mentioned only as an example, and that this invention is equally applicable to many other IC technologies such as ASSP (application-specific standard product), SoC (system on a chip), and even the design of integrated circuits that have little or no predetermined structure.)

The next step shown in FIG. 1 is floorplanning 30. In this step various parts of the technology-mapped synthesis from step 20 are assigned in a general way to various relatively large blocks of the target IC.

The next step is actual placement 40 of particular functions from synthesis 20 in particular functional circuit blocks within the large blocks dealt with in floorplanning 30.

The next step is laying out the routing 50 of all necessary connections to, from, and/or between the blocks placed in step 40.

The next step is verification 60, which may include such things as design rule checking ("DRC") and layout vs. schematic ("LVS") checking. The purpose of this step is to ensure, to the greatest extent possible, that the specification for the IC that has been developed in the preceding steps will produce an IC that will perform the functions of the starting circuit design as intended. (Of course, some of the earlier steps may also have included verification and/or checking aspects for similar purposes.)

The final step is GDS signoff 70, in which the specification for the IC that has been developed and verified in the preceding steps is handed off in an industry-standard format such as GDS for actual manufacturing of the IC.

Figure 2:
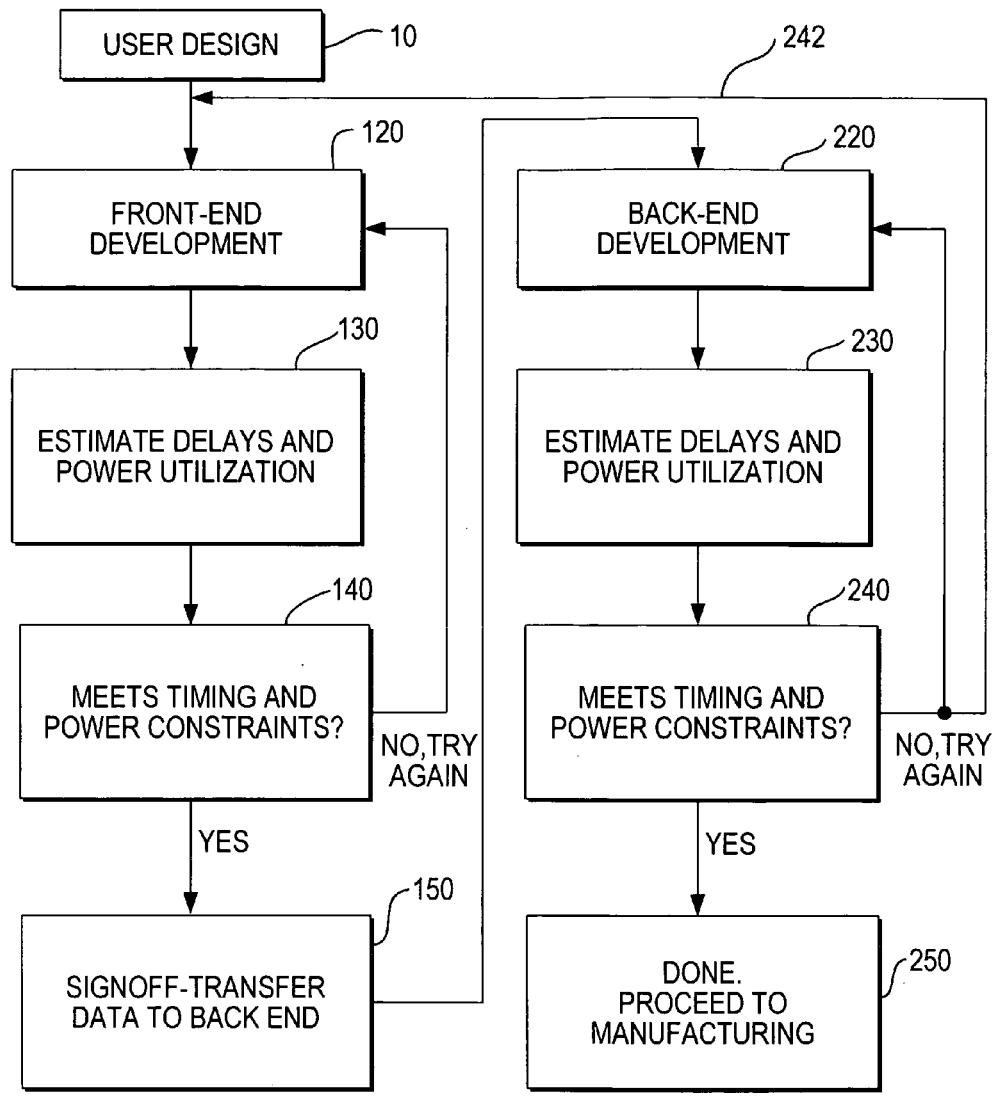
FIG. 2 is a simplified flow diagram of other aspects of an illustrative process for designing an integrated circuit to implement a circuit design.

As was mentioned in the Background section of this specification, an IC design flow of the type shown in FIG. 1 is typically broken into at least two parts that are respectively handled by different groups of people. Without being specific as to where in FIG. 1 the signoff point between these two groups is, FIG. 2 shows in general terms typical responsibilities of each of these two groups. The left-hand column of steps in FIG. 2 is performed by a so-called front-end development group (also sometimes referred to herein as the circuit design group). The right-hand column of steps in FIG. 2 is performed by a so-called back-end group (also sometimes referred to herein as the IC design group). The front-end group is typically concerned (at least primarily) with circuit functionality. The back-end group is concerned (at least primarily) with implementation of the circuit design on an IC and possibly also manufacture of the IC (although that latter function may be handled by a separate IC fabricator ("fab")).

As shown in FIG. 2, typical responsibilities of the front-end development group are user design 10 followed by front-end development 120 of that design (i.e., to some presently unspecified signoff point in the FIG. 1 design flow). In step 130 the front-end development group analyzes what it has developed in step 120 for such characteristics (e.g., anticipated performance aspects) as timing ("delays") and power utilization.

In step 140 the front-end development group compares the results of step 130 to characteristics that the circuit must have (e.g., whether the results of step 130 show that the circuit developed thus far will meet timing and power constraints that have been specified for the circuit). If the result of step 140 is negative, the front-end development group returns to step 120 to try a new development of user design 10. When the result of step 140 is positive, signoff step 150 is performed to transfer what has been developed by the front-end development group to the back-end development group.

In step 220 (and subsequent FIG. 2 steps) the back-end development group attempts to take what has been handed off by the front-end group through whatever steps remain in the FIG. 1 flow. At the high level shown in FIG. 2 this involves back-end development step 220, which moves the design closer to (and ultimately to) a specification for manufacturing an IC. In step 230 the back-end group performs something like above-described step 130, but on the results of step 220. In step 240 the back-end group performs a step like 140, but on the results of step 230. If the result of step 240 is negative, the back-end group may try one or more iterations starting with step 220 again. If and when the result of step 240 is positive, step 250 is performed to proceed to manufacturing. However, if the back-end group is not able to achieve a positive result from step 240, it may be forced to return the design to the front-end group via flow path 242 for redevelopment by the front-end group. This is generally regarded as highly undesirable for reasons such as delay and cost. Selection of the signoff point (in the FIG. 1 flow) between the front-end group and the back-end group can have a major impact on the probability of needing to invoke undesirable flow path 242 in FIG. 2.

Figure 3:
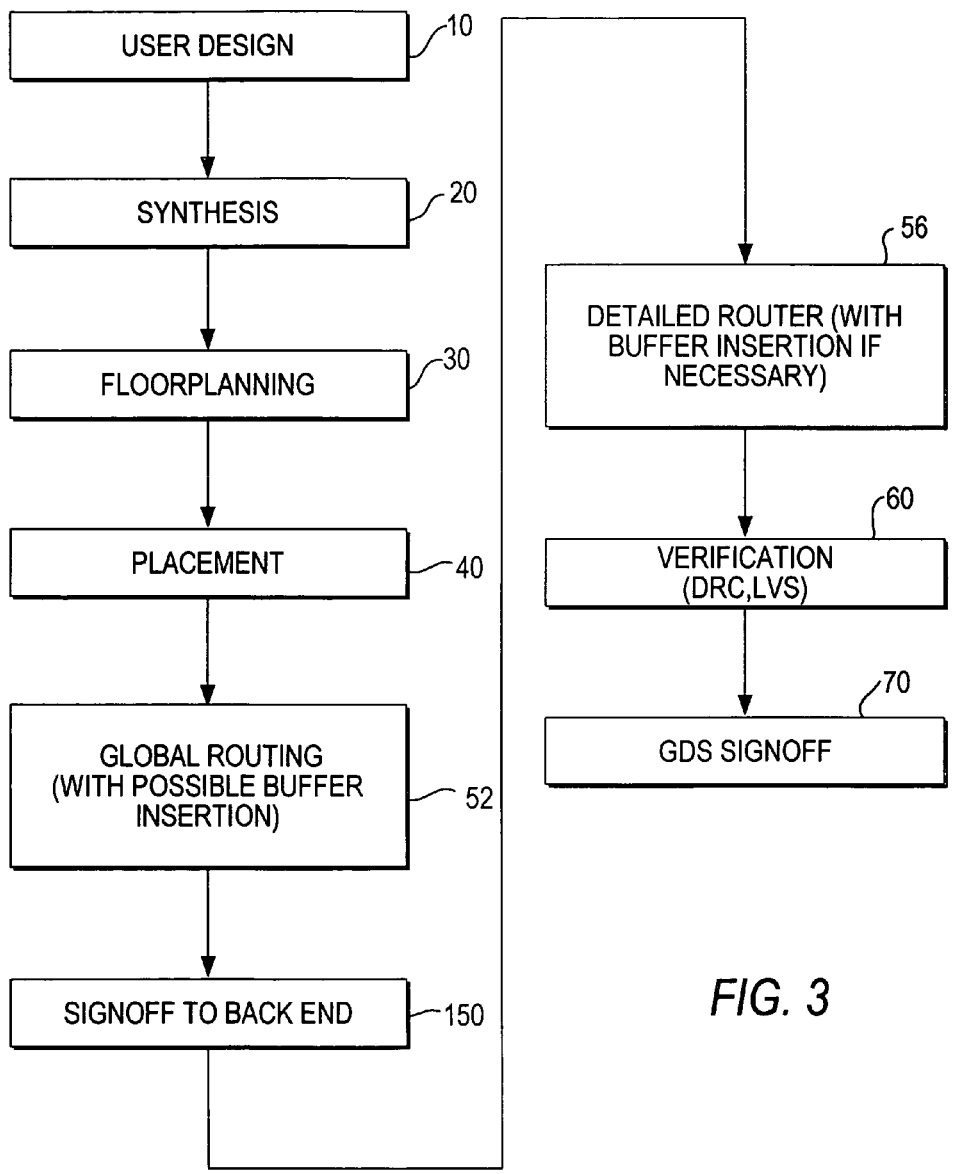
FIG. 3 is a simplified flow diagram of an illustrative embodiment of certain aspects of the invention.

FIG. 3 shows an illustrative embodiment of modification of FIG. 1 with an advantageous point for front-end-to-back-end signoff in accordance with this invention. In FIG. 3 steps 10, 20, 30, and 40 are similar to the correspondingly numbered steps in FIG. 1 and therefore do not need to be described again. In FIG. 3, however, the routing step 50 in FIG. 1 is broken into two separate parts. These two parts are global routing part 52 and detailed router part 56. Global routing part 52 is handled by the front-end development group (along with all other steps in the left-hand column of steps in FIG. 3). Detailed router part 56 is handled by the back-end development group (along with all other steps in the right-hand column of steps in FIG. 3).

Global routing 52 refers to a relatively general level of routing decision-making and assignment. For example, global routing 52 involves deciding in general how connections to, from, and/or between circuit blocks that have already been placed (step 40) on the "real estate" of the IC will be routed, without deciding specifically which circuit tracks in various bundles of possible circuit tracks will actually be used to make each such connection. An analogy in going between two points in a city would be deciding that, to go from point A to B, one will first go straight east from point A for a certain distance, then one will go straight north to point B. The actual streets that will be used for these two legs of the trip are not yet decided on. (That is left for subsequent decision by the detailed router.) What are important at the global routing stage are things like the number and types(s) of conductor segments that will be used to make a connection, the lengths of those conductor segments, etc.

Even without the additional results of detailed routing (subsequent step 56), the results of global routing step 52 provide a great deal of information that can be important to such things as the timing performance of the IC design being developed. Remember that before signoff step 150 is performed in FIG. 3, the front-end development group must have successfully completed all of its checks 130 and 140 (FIG. 2) on what is has developed. Thus, leaving global routing 52 in the hands of the front-end development group as shown in FIG. 3 enables that group to check such things as timing much farther into the IC design process than would be possible if signoff preceded all routing decisions. This greatly reduces the chances that the front-end development group will hand off to the back-end development group a design for which the back-end design group cannot achieve a satisfactory final IC design (e.g., with respect to timing performance). On the other hand, leaving detailed routing (step 56) to the back-end development group keeps the front-end development group's task from becoming too complex and unnecessarily specific with respect to routing.

After signoff step 150, the back-end development group begins its work by performing detailed router step 56 to complete the routing process. (Note that steps 52 and 56 in FIG. 3 collectively constitute routing step 50 in FIG. 1.) As is at least implicit in what has already been said, detailed router step 56 determines the exact final wiring of the IC being developed. In particular, this step determines the exact position of every interconnection wire in the final IC design.

After completing step 56, back-end development continues with steps 60 and 70 (similar to the similarly numbered steps in FIG. 1 and therefore not requiring repeated description here). Again it should be remembered that before the back-end development group can proceed to GDS signoff step 70, it must have successfully completed checks such as those shown at 230 and 240 in FIG. 2, as well as verification step 60.

The flow shown in FIG. 3 covers either of two variations. In one variation global routing step 52 includes the insertion of buffers where needed in the generalized routing plan determined in that step. Such buffers may be needed (1) to boost signals propagating in relatively long interconnections and/or in interconnections with many taps and therefore with significant loading, and/or (2) to improve circuit timing performance. If the global routing software tool used for step 52 has the ability to perform such buffer insertion, then it may be desirable to perform step 52 in that way. If buffer insertion is thus done in step 52 prior to signoff 150, then buffer insertion can be omitted from detailed router step 56 after signoff 150.

On the other hand, the global software tool used for step 52 may not have the ability to do buffer insertion. In that event, buffer insertion can be done in detailed router step 56 after signoff 150.

Figure 4:
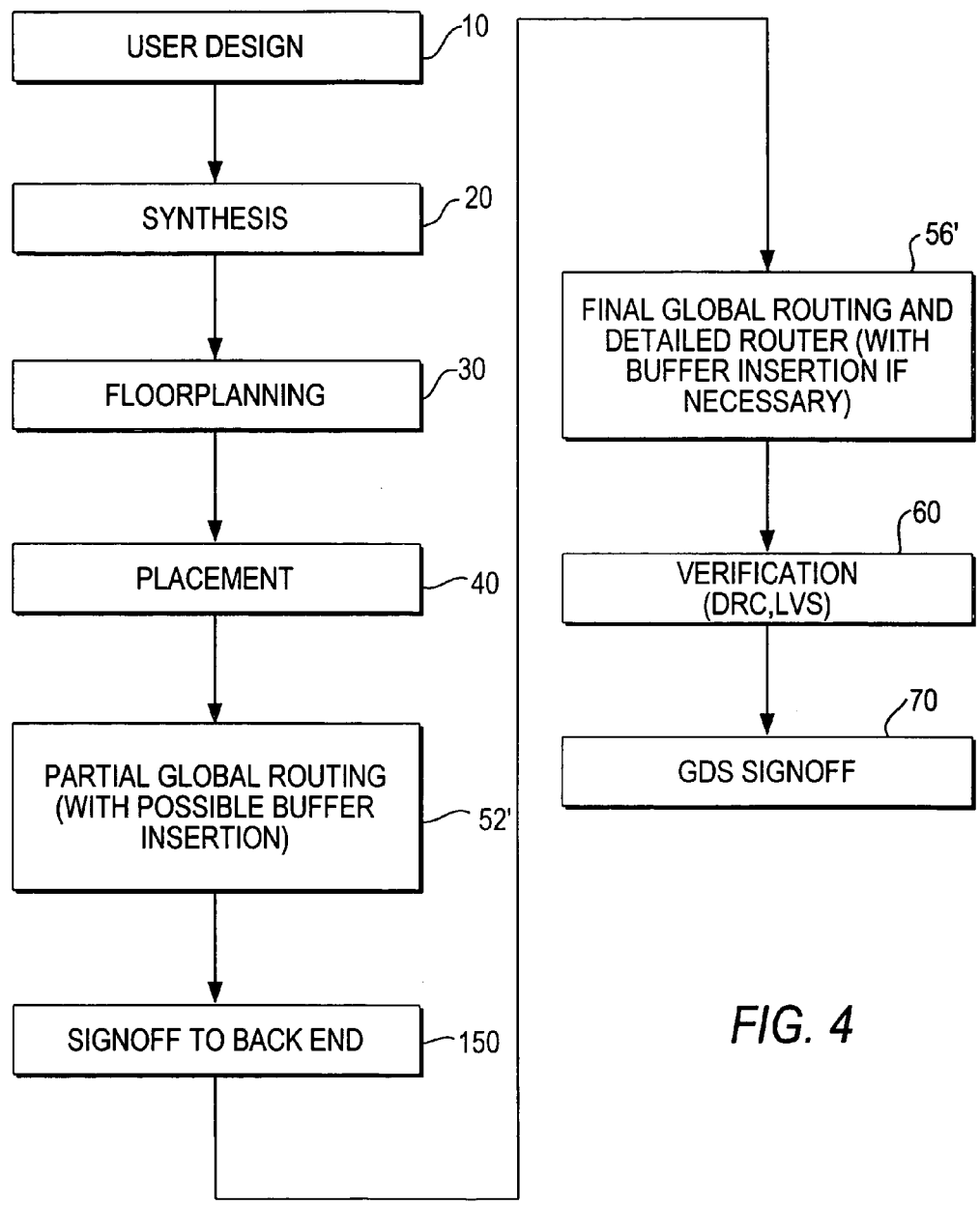
FIG. 4 shows a possible modification of FIG. 3 in accordance with the invention.

A possible modification of flows of the type illustrated by FIG. 3 is shown in FIG. 4. In this embodiment front-end step 52' includes only partial global routing, e.g., of only the subset of connections that are important for such considerations as timing, power, and/or congestion modeling. Associated buffer insertion may or may not be included. When the front-end development group has achieved a satisfactory design through step 52', signoff step 150 is performed. Back-end development then begins with step 56', which includes completion of the global routing that was partly performed in step 52' and then detailed routing. Step 56' also includes any necessary buffer insertion that was not performed in step 52'.

Figure 5:
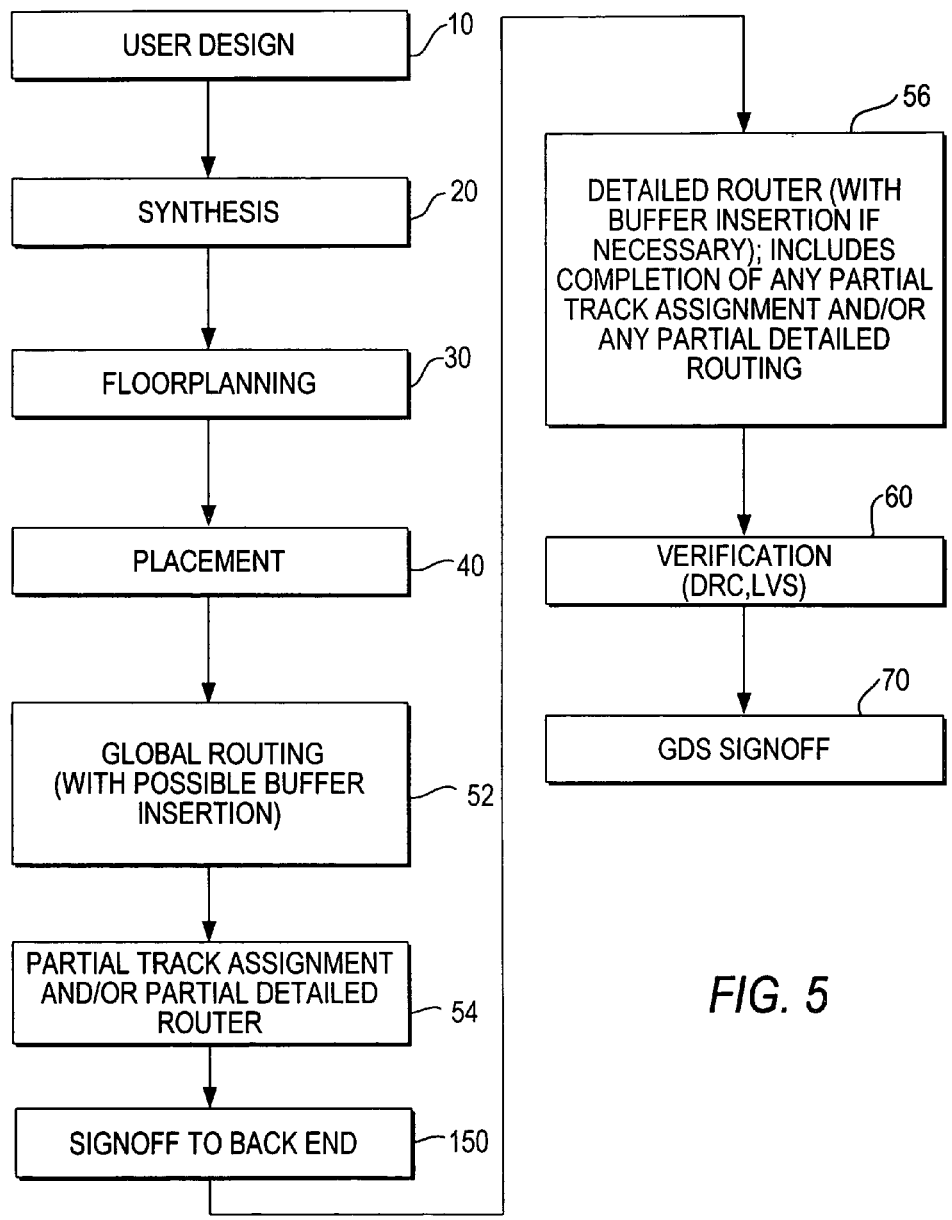
FIG. 5 is a simplified flow diagram of another illustrative embodiment of certain aspects of the invention.

Another illustrative embodiment in accordance with the invention is shown in FIG. 5. The difference between FIG. 3 and FIG. 5 is that in FIG. 5 some additional routing work is done by the front-end development group in step 54 prior to signoff 150. This additional work may be either or both of (1) partial track assignment, and (2) some of the detailed routing. The idea here is that it is possible to select a subset of connections that are important for timing and/or power, and take them farther in the flow in the front-end development by performing track assignment and detailed routing on them in front-end step 54. The rest of the connections would continue to have only global routing information from step 52 prior to signoff step 150. After signoff, final detailed router step 56 is performed. This includes completion of any partial track assignment and/or completion of any partial detailed routing from step 54. It also includes any necessary buffer insertion that was not done earlier.

Again, the more that can be done in the left-hand column of steps prior to signoff in FIG. 5, the more likely it will be that the design turned over to the back-end development group can be successfully implemented by that group in a final IC design that meets all the requirements for the circuit specified at the start of the process. On the other hand, the embodiment shown in FIG. 5 still leaves the massive details of the complete and final detailed routing (step 56) to the back-end development group, rather than burdening the front-end development group with all of that work and all of that detail.

It will be understood that although people or groups are sometimes referred to herein, the methods that are the subject of this invention are largely automated. Conventional or substantially conventional software tools can be used for this automation. The various people using these software tools are mentioned largely for the purpose of explaining that various different organizations are typically involved and are therefore responsible for different parts of the task.

This is useful to explain why the invention is needed (e.g., for reasons of efficiency, expertise, cost, etc.), and especially the disadvantages of and penalties associated with having to move back upstream from the back-end development group to the front-end development group (e.g., via path 242 in FIG. 2) when a circuit design does not progress properly toward an acceptable design for an IC implementation. Although people are involved in the process and are responsible for various parts of it, the methods of this invention are principally directed to where a largely automated design flow is most advantageously broken or interrupted so that results of a first part of the process can be handed off to a second part of the process with reduced risk that what is handed off cannot be successfully taken through to the end of the process without having to go back from the second part to the first part for another iteration of the first part.

It will be understood that the foregoing is only illustrative of the principles of the invention, and that various modifications can be made by those skilled in the art without departing from the scope and spirit of the invention. For example, although development of a design for a structured ASIC has been mentioned as an illustration, the invention is equally applicable to doing designs for many other types of ICs.

The invention claimed is:

1. A method of designing an integrated circuit implementation of a circuit design comprising:
   processing the circuit design through at least a portion of global routing of the circuit design for the integrated circuit implementation, the processing including all placement required for the integrated circuit implementation, but the processing not including all final detailed routing required for the integrated circuit implementation;
   verifying that results of the processing meet at least one performance criterion specified as part of the circuit design; and
   if results of the verifying are positive, further developing the results of the processing into a design for the integrated circuit implementation, the further developing including at least completion of all final detailed routing required for the integrated circuit implementation, but the further developing not including any of the placement required for the integrated circuit implementation.

2. The method defined in claim 1 wherein the global routing includes at least some buffer insertion.

3. The method defined in claim 1 wherein the performance criterion includes an aspect of circuit operation timing.

4. The method defined in claim 1 wherein the performance criterion includes an aspect of circuit operation power consumption.

5. The method defined in claim 1 further comprising:
   if results of the verifying are negative, repeating the processing to produce new results that are different from the results of the previous performance of the processing; and
   repeating the verifying on the new results.

6. The method defined in claim 1 wherein the global routing includes partial track assignment for the integrated circuit implementation.

7. The method defined in claim 6 wherein the further developing includes completion of the partial track assignment for the integrated circuit implementation.

8. The method defined in claim 1 wherein the global routing includes partial final detailed routing for the integrated circuit implementation.

9. A method of designing an integrated circuit implementation of a circuit design comprising:
   performing front-end development of the circuit design;
   testing results of the front-end development for compliance with a circuit performance constraint that is part of the circuit design;
   if and only if results of the testing are positive, then performing back-end development of the results of the first-mentioned performing;
   testing results of the back-end development for compliance with a circuit performance constraint that is part of the circuit design; and
   if and only if results of the second-mentioned testing are positive, then processing the results of the second-mentioned performing for use in fabrication of the integrated circuit implementation;
   wherein the front-end development includes all placement and at least some global routing for the integrated circuit implementation, but not all final detailed routing for that implementation, and wherein the back-end development includes at least completion of all final detailed routing required for the integrated circuit implementation but none of the placement required for that implementation.

10. The method defined in claim 9 wherein the front-end development includes at least some buffer insertion in the routing for the integrated circuit implementation.

11. The method defined in claim 9 wherein the front-end development includes partial track assignment of the routing for the integrated circuit implementation.

12. The method defined in claim 11 wherein the back-end development includes completion of track assignment for the routing for the integrated circuit implementation.

13. The method defined in claim 9 wherein the front-end development includes partial detailed routing for the integrated circuit implementation.

14. The method defined in claim 9 wherein the first-mentioned circuit performance constraint comprises timing.

15. The method defined in claim 9 wherein the second-mentioned circuit performance constraint comprises timing.

16. The method defined in claim 9 wherein the first-mentioned circuit performance constraint comprises power consumption.

17. The method defined in claim 9 wherein the second-mentioned circuit performance constraint comprises power consumption.

18. A method of designing an integrated circuit implementation of a circuit design comprising:
  synthesizing the circuit design for the integrated circuit implementation;
  floorplanning results of the synthesizing for the integrated circuit implementation;
  placing results of the floorplanning for the integrated circuit implementation;
  at least partial global routing results of the placing for the integrated circuit implementation; and
  signing off results of the at least partial global routing for further processing in separate back-end development which comprises:
  at least some final detailed routing of results of the signing off for the integrated circuit implementation; and
  verifying results of the at least some final detailed routing for the integrated circuit implementation, the separate back-end development not including any repetition of placing like the placing performed prior to the signing off.

* * * * *